United States Patent [19]
Sugiura

[11] Patent Number: 5,349,292
[45] Date of Patent: Sep. 20, 1994

[54] MAGNETIC RESONANCE IMAGING APPARATUS

[75] Inventor: Satoshi Sugiura, Ootawara, Japan

[73] Assignee: Kubushiki Kaisha Toshiba, Kawasaki, Japan

[21] Appl. No.: 23,571

[22] Filed: Feb. 26, 1993

[30] Foreign Application Priority Data

Feb. 27, 1992 [JP] Japan .................. 4-040886

[51] Int. Cl.$^5$ ............................................ G01R 33/20
[52] U.S. Cl. .................................................... 324/309
[58] Field of Search ............... 324/300, 307, 309, 310, 324/311, 312, 313, 314, 318, 322; 128/653.2

[56] References Cited

U.S. PATENT DOCUMENTS

| | | | |
|---|---|---|---|
| 4,609,872 | 9/1986 | O'Donnell | 324/306 |
| 4,818,940 | 4/1989 | Hennig et al. | 324/309 |
| 4,893,080 | 1/1990 | Luyten et al. | 324/309 |

OTHER PUBLICATIONS

J. Hennig, et al., "Rare Imaging: A Fast Imaging Method for Clinical MR", 1986; pp. 823-833.

*Primary Examiner*—Michael J. Tokar
*Attorney, Agent, or Firm*—Limbach & Limbach

[57] ABSTRACT

A magnetic resonance imaging apparatus based on a multi-echo imaging scheme and a multi-slice imaging scheme, is arranged to acquire all components of an echo signal which corresponds to low-frequency components in an image which is small in the absolute value of the phase encoding amount in a sufficient time to ensure a desired signal-to-noise ratio and to acquire echo signals which correspond to high-frequency components in the image which are large in the absolute value of the phase encoding amount in acquisition times shorter than that time to ensure a desired signal-to-noise ratio. The signal acquisition time can be reduced by shortening the time interval at which the 180° pulses are generated. Due to reducing the signal acquisition time, parts of the echo signal in the read direction are not acquired. The components which have not been acquired are estimated by use of complex conjugate data of acquired data or mere 0 values for image reconstruction. Thereby, image data acquisition time for one slice can be reduced to reserve the number of multi-slice acquisitions without degrading the signal-to-noise ratio in the image.

10 Claims, 5 Drawing Sheets

MAGNETIC RESONANCE IMAGING APPARATUS

BACKGROUND OF THE INVENTION

1. Field of the Invention

The present invention relates to a magnetic resonance imaging apparatus which is in accordance with multi-echo imaging scheme and multi-slice imaging scheme.

2. Description of the Related Art

A multi-echo imaging scheme was developed recently in which multiple 180° pulses are applied after application of a 90° pulse to generate multiple spin-echo signals (hereinafter simply referred to as echo signals) per one excitation, and a different phase encoding amount is assigned to each of the echo signals, i.e., multiple echo signals are allocated to regions having different spatial frequencies, thereby acquiring a magnetic resonance (MR) image at high speed. One example of the multi-echo imaging scheme is known as "RARE (Rapid Acquisition with Relaxation Enhancement" imaging.

It has also been considered to combine the multi-echo imaging scheme with a multi-slice imaging scheme which acquires image data from multiple slices in one repetition time TR, that is, excites another or other slices in the interval that elapses from the acquisition of the last echo signal from one slice to the time when the next 90° pulse for the one slice is applied (a 90° pulse and multiple 180° pulses for other slices are similarly applied). An example of the combined use of the multi-echo scheme and the multi-slice scheme has been disclosed and described in the specification of U.S. Pat. No. 4,818,940.

FIG. 1 shows a conventional pulse sequence in which the multi-echo and multi-slice imaging schemes are combined. The pulse sequence shown in FIG. 1 is intended to reconstruct an image of one slice by applying five 180° pulses to the one slice after application of a 90° pulse thereto to thereby generate five echo signals and acquiring the echo signals while varying their respective phase encoding amounts. That is, the first through fifth echo signals are allocated to five regions which differ in phase encoding amount on the spatial frequency plane. Two-dimensional Fourier transformation (2DFT) of the echo signals represented by spatial frequencies permits the reconstruction of an MR image of a slice.

The signal-to-noise ratio in an image is in inverse proportion to the square root of the bandwidth of echo signals. To improve the signal-to-noise ratio in image while preserving the same resolution, it is a common practice to narrow the bandwidth of echo signals by making the signal acquisition time ta1 longer and to make the magnitude of the readout gradient magnetic field Gr lower. In FIG. 2, there is shown a pulse sequence in which the bandwidth of echo signals is narrowed so as to improve the signal-to-noise ratio. In FIGS. 1 and 2, the axes of abscissa (time axis) are of the same scale. As can be seen from FIG. 2, therefore, the acquisition time ta2 for an echo signal is longer than the time ta1 in FIG. 1. The purpose of decreasing the magnitude of the readout gradient field Gr is to narrow the bandwidth (frequency) of one pixel while keeping the effective field of view. The magnitude of the readout gradient field Gr is determined in due consideration of the imhomogeneity in the static magnetic field and the generation of chemical artifacts.

By lowering the magnitude of the readout gradient field Gr to increase the echo-signal acquisition time from ta1 to ta2 in this manner, the signal-to-noise ratio can be increased by a factor of the square root of a2/a1.

In either of FIGS. 1 and 2, the time interval between 180° pulses is constant (it is twice the time interval between the 90° pulse and the first 180° pulse). In FIG. 2, this time interval is $2\tau 1$, which is longer than in FIG. 1.

As can be seen from FIGS. 1 and 2, however, increasing the echo-signal acquisition time results in increasing the time taken to acquire image data from one slice from ts1 to ts3. This will decrease the number of slices that can be obtained within a repetition time TR from TR/ts1 to TR/ts2. If the repetition time TR is made longer to keep the number of slices that can be obtained, the time taken to acquire image data is undesirably made longer. Thus, a magnetic resonance imaging apparatus which combines the multi-echo and multi-slice imaging schemes has a drawback that, if each echo acquisition time is made longer so as to improve the signal-to-noise ratio, the number of slices that can be acquired within a preselected repetition time TR is decreased. In other words, such a magnetic resonance imaging apparatus can improve the signal-to-noise ratio at the expense of the number of multiple slices acquired.

SUMMARY OF THE INVENTION

It is therefore an object of the present invention to provide a magnetic resonance imaging apparatus which combines multi-echo and multi-slice imaging schemes and permits the signal-to-noise ratio in an MR image to be improved without decreasing the number of multiple slices that can be acquired within a preselected repetition time.

A magnetic resonance imaging apparatus according to the present invention applies a 90° pulse and multiple 180° pulses to an object under examination, assigns a different phase encoding amount to each of echo signals generated at each 180° pulse to acquire image data for one slice, and acquires image data for another or other slices within a 90° pulse repetition period for one slice. The apparatus is characterized by provision of acquisition means for acquiring at least an echo signal which, of the echo signals assigned different phase encoding amounts, is large in phase encoding amount in a time shorter than a sufficient acquisition time to ensure a desired signal-to-noise ratio, obtaining means for obtaining components of echo signals which have not been acquired by the acquisition means, and means for reconstructing a magnetic resonance image by use of the echo signal acquired by the acquisition means and the components obtained by the obtaining means.

By reducing acquisition times for echo signals which correspond to high-frequency components in an image and which are large in phase encoding amount, the magnetic resonance imaging apparatus of the present invention can decrease the bandwidth of echo signals, reduce the one-slice image data acquisition time, reduce the examination time, and improve the signal-to-noise ratio while reserving the number of multi-slice acquisitions.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE PREFERRED EMBODIMENTS

Figure 3:
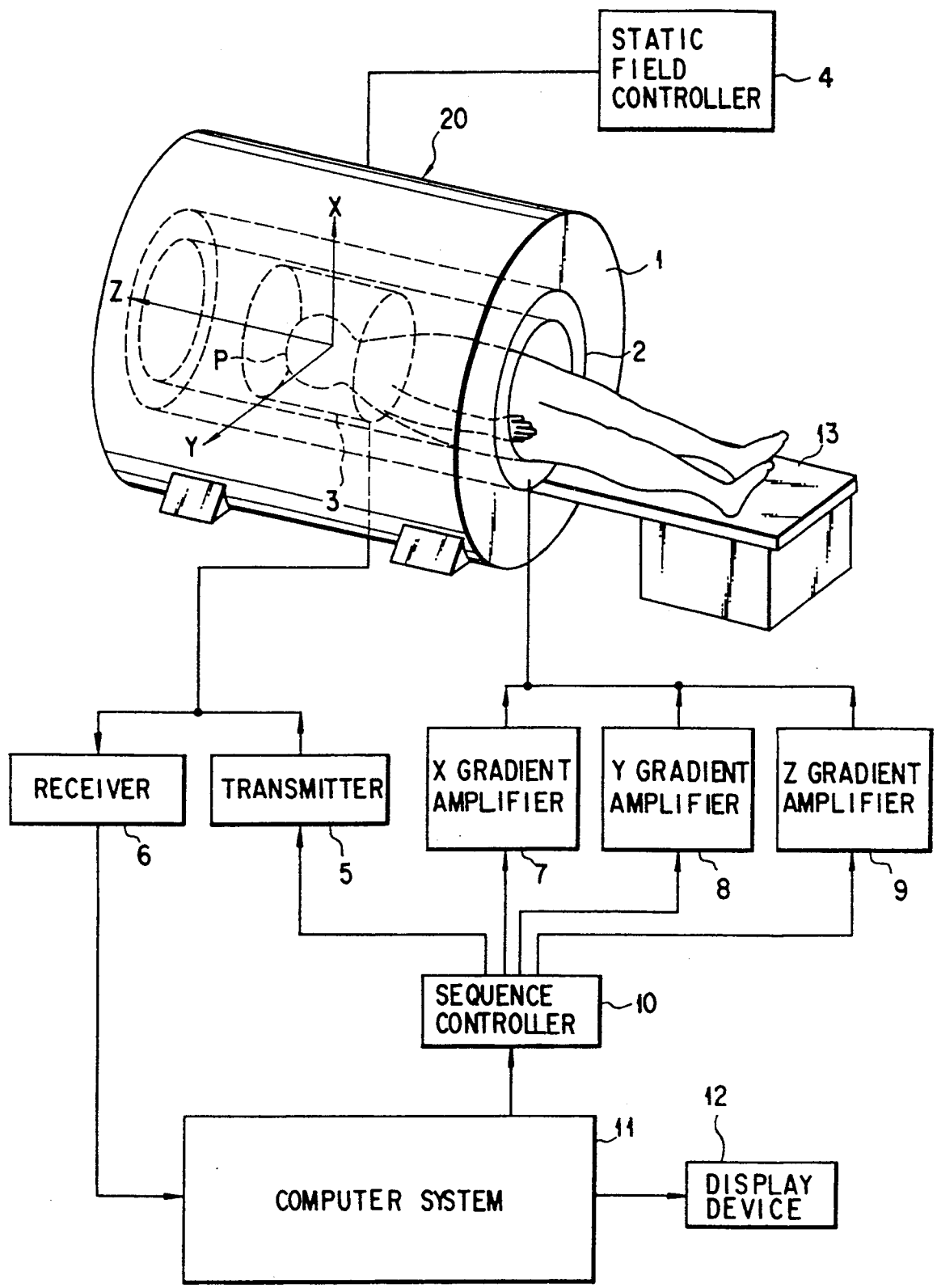
FIG. 3 is a block diagram of a magnetic resonance imaging apparatus according to an embodiment of the present invention.

A preferred embodiment of a magnetic resonance imaging apparatus according to the present invention will now be described with reference to the accompanying drawings. Referring to FIG. 3, there is illustrated a magnetic resonance imaging apparatus of the present invention in block form. A static magnetic field forming magnet 1, an x-axis, y-axis, and z-axis gradient magnetic fields forming coil system 2, and a transmitter/receiver coil system 3 are installed in a gantry 20. The transmitter/receiver coil 3 may be directly attached to a human body P under examination instead of being embedded in the gantry.

The magnet 1, serving as a means of forming a static magnetic field, can be constructed of a superconducting or normal-conducting coil. The x-axis, y-axis, and z-axis gradient fields forming coil system 2 is adapted to generate an x-axis gradient field Gx, a y-axis gradient field Gy, and a z-axis gradient field Gz. The transmitter/receiver coil 3 emits a radio-frequency (RF) pulse serving as a selective excitation pulse for selecting a slice to be imaged of the human body P and detects a magnetic resonance signal (echo signal) generated by magnetic resonance induced in the selected slice. The human body P, laid down an examination couch 13, is allowed to have access to the imaging space within the gantry 20. The imaging space is a spherical space in which imaging magnetic fields are formed, and imaging diagnosis can be made only when an imaging portion of the human body lies within this space.

The static magnetic field forming magnet 1 is driven by a static field controller 4. The transmitter/receiver coil 3 is coupled to a transmitter 5 at the time of inducing magnetic resonance in the human body and to a receiver 6 at the time of detecting magnetic resonance signals from the human body. The x-axis, y-axis, and z-axis gradient fields forming coil system 2 is driven by x-axis, y-axis, and z-axis gradient field power supplies (amplifiers) 7, 8, and 9.

The x-axis, y-axis, and z-axis gradient field amplifiers 7, 8, and 9, and the transmitter 5 are driven by a sequence controller 10, thereby generating an x-axis gradient field Gx, a y-axis gradient field Gy, a z-axis gradient field Gz, and a radio-frequency (RF) pulse in accordance with a predetermined pulse sequence which will be described later. In this case, the gradient fields Gx, Gy, and Gz are used as a phase-encoding gradient field Ge, a readout gradient field Gr, and a slice-selection gradient field Gs, respectively. A computer system 11 drives and controls the sequence controller 10 and receives magnetic resonance signals from the receiver 6 for signal processing, thereby reconstructing a cross-sectional magnetic resonance (MR) image of the human body and displaying it on a display device 12.

Reference will now be made to a pulse sequence of FIG. 4 to describe the operation of the present embodiment. According to the present invention, multi-echo and multi-slice schemes are combined to acquire image data at high-speed. In this pulse sequence, as in the prior art pulse sequences shown in FIGS. 1 and 2, five 180° pulses P1, P2, P3, P4, and P5 are applied subsequent to a 90° pulse P0, thereby generating five echo signals E1, E2, E3, E4, and E5 per excitation. The five echo signals are acquired while applying different phase encoding gradient fields, thus obtaining image data from a selected slice. The other slice (generally more than one slice) is likewise excited during the interval from the termination of acquisition of image data for one slice until the time that the next 90° pulse for the one slice is applied, thereby permitting acquisition of image data from the other slice within the repetition time TR.

Figure 1:
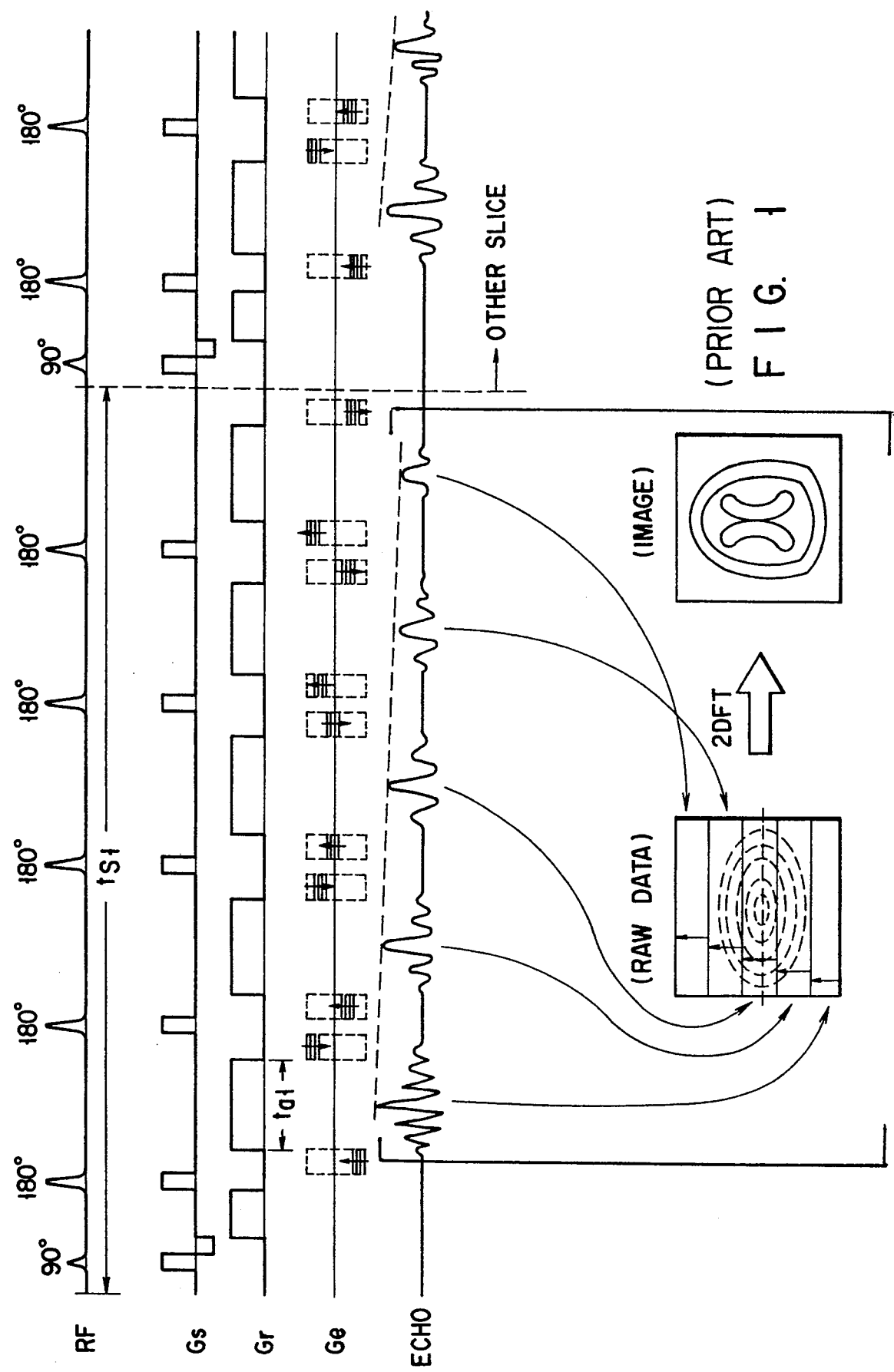
FIG. 1 shows a pulse sequence used in a conventional magnetic resonance imaging apparatus which combines multi-echo and multi-slice imaging schemes.
Figure 2:
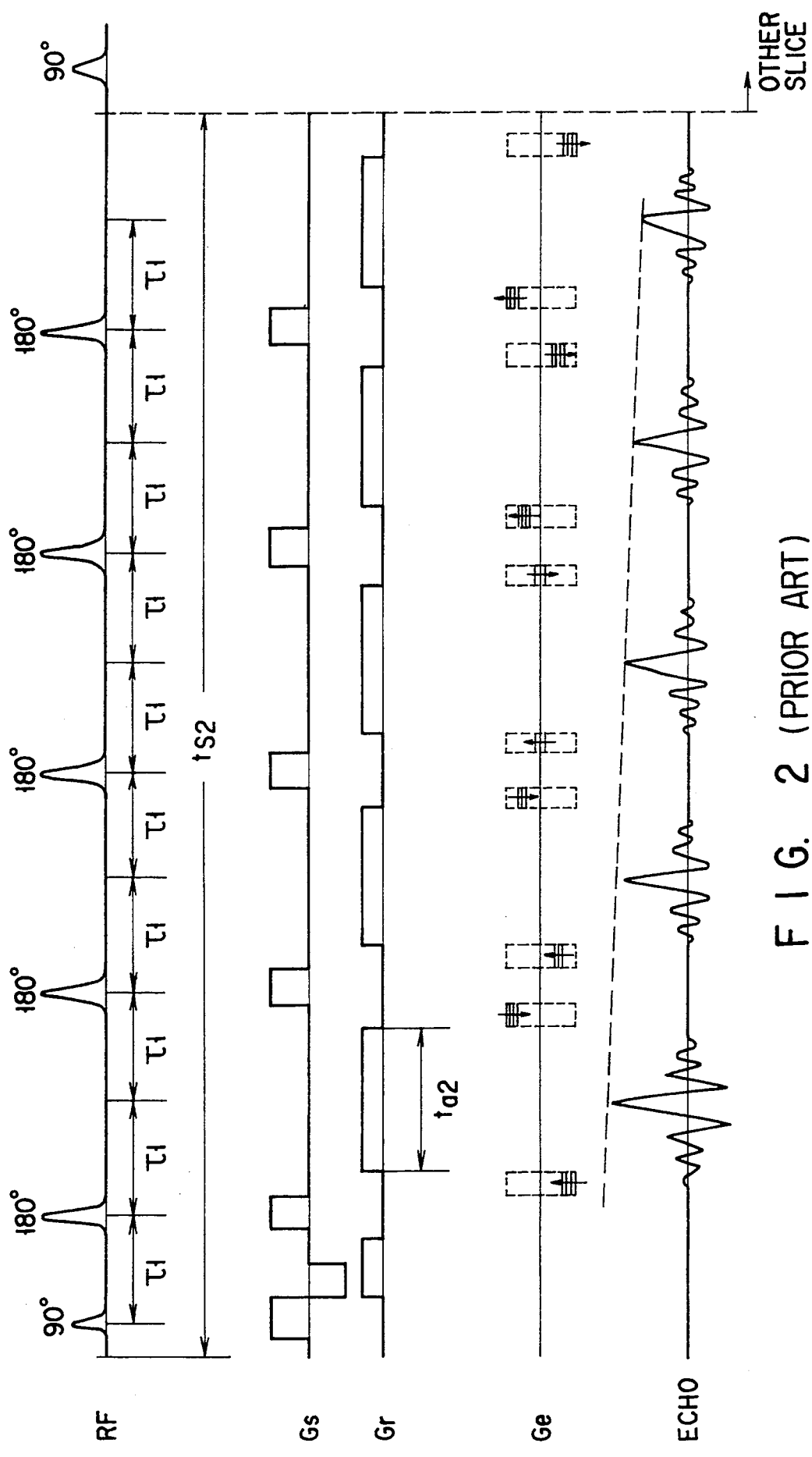
FIG. 2 shows a pulse sequence in which, in order to improve the signal-to-noise ratio in an MR image in the sequence of FIG. 1, the application time of the readout gradient field is made longer to narrow the bandwidth of echo signals.

As in the prior arts in FIGS. 1 and 2, the magnitude of the phase encoding gradient field Ge is determined so that the first through fifth echo signals E1 through E5 may be allocated respectively to first through fifth phase encoding regions on a spatial frequency plane (defined by a phase encoding direction and a read direction) which range in phase encoding amount from a large negative value to a large positive value. For example, assuming that the phase encoding amounts include a total of 256 steps from −128 to +128, the first echo signal E1 is allocated to the −128 to −77 encoding steps, the second echo signal E2 to the −76 to −26 encoding steps, the third echo signal E3 to the −25 to +24 encoding steps, the fourth echo signal E4 to the +25 to +76 encoding steps, and the fifth echo signal E5 to +77 to +127 steps.

Figure 4:
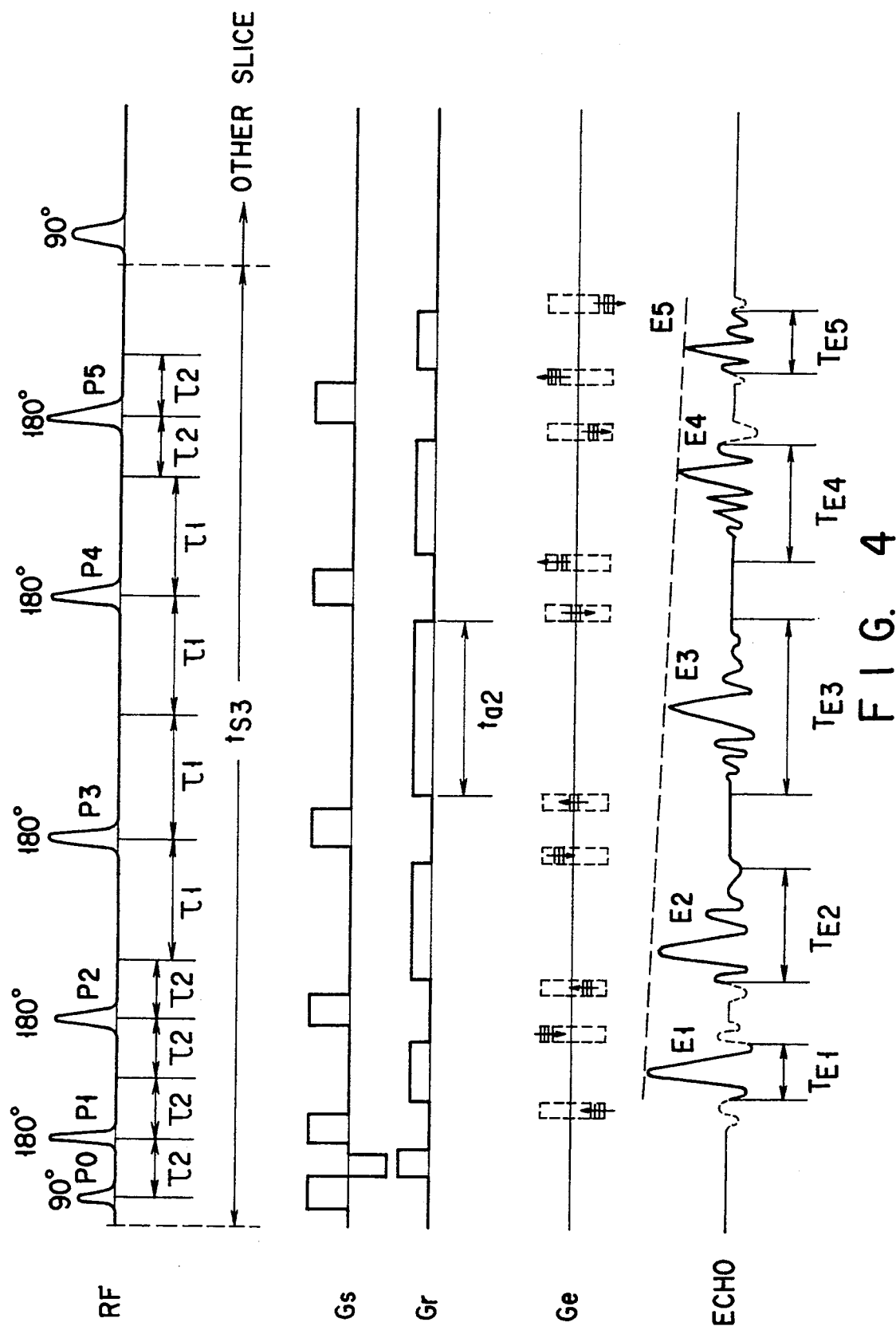
FIG. 4 shows a pulse sequence used in the apparatus of FIG. 3.

Though not shown in FIG. 4, as in the prior arts of FIGS. 1 and 2, during the interval from the acquisition of the fifth echo signal E5 from a slice to the time when the next 90° pulse for that slice is applied, a similar pulse sequence for exciting another slice is executed to acquire image data from it.

The pulse sequence according to the present invention is distinct from the prior arts of FIGS. 1 and 2 in that the time interval between each 180° pulse and the next 180° pulse for one slice, or the time interval at which echo signals are generated is not fixed but increases gradually and then decreases gradually after a maximum interval is reached. That is, the 180° pulse time interval is set such that, assuming the time interval between the 90° pulse P0 and the first 180° pulse P1 to be $\tau 2$, the time interval between the first and second 180° pulses P1 and P2 is $2\tau 2$, the time interval between the second and third 180° pulses P2 and P3 is $\tau 2+\tau 1$, the time interval between the third and fourth 180° pulses P3 and P4 is $2\tau 1$, and the time interval between the fourth and fifth 180° pulses P4 and P5 is $\tau1+\tau2$. Note here that $\tau1$ in FIG. 4 is equal to $\tau1$ in FIG. 2, and $\tau2$ is shorter than $\tau1$.

Thus, each of the first and second echo signals E1 and E2 is generated a time $\tau2$ after the center of the corresponding 180° pulse P1 or P2, each of the third and fourth echo signals E3 and E4 is generated $\tau1$ after the center of the corresponding 180° pulse P3 or P4, and the fifth echo signal E5 is generated $\tau2$ after the center of the fifth 180° pulse P5.

In order to improve the signal-to-noise ratio in images without decreasing the number of multiple slices acquired, the present embodiment provides a sufficient time to obtain a required signal-to-noise ratio for the time TE3 taken to acquire the third echo signal E3 which corresponds to low frequency components most affecting the signal-to-noise ratio and contrast of images and is small in the absolute value of the phase encoding amount. The time TE1, TE2, TE4, or TE5, taken to acquire a corresponding one of the other echo signals E1, E2, E4, and E5 which correspond to high-frequency components little affecting the signal-to-noise ratio and contrast of image and are large in the absolute value of the phase encoding amount, is set shorter than TE3. Each of the echo acquisition times is set to satisfy that TE3 (=ta2)>TE2 (=TE4)>TE1 (=TE5).

Figure 5:
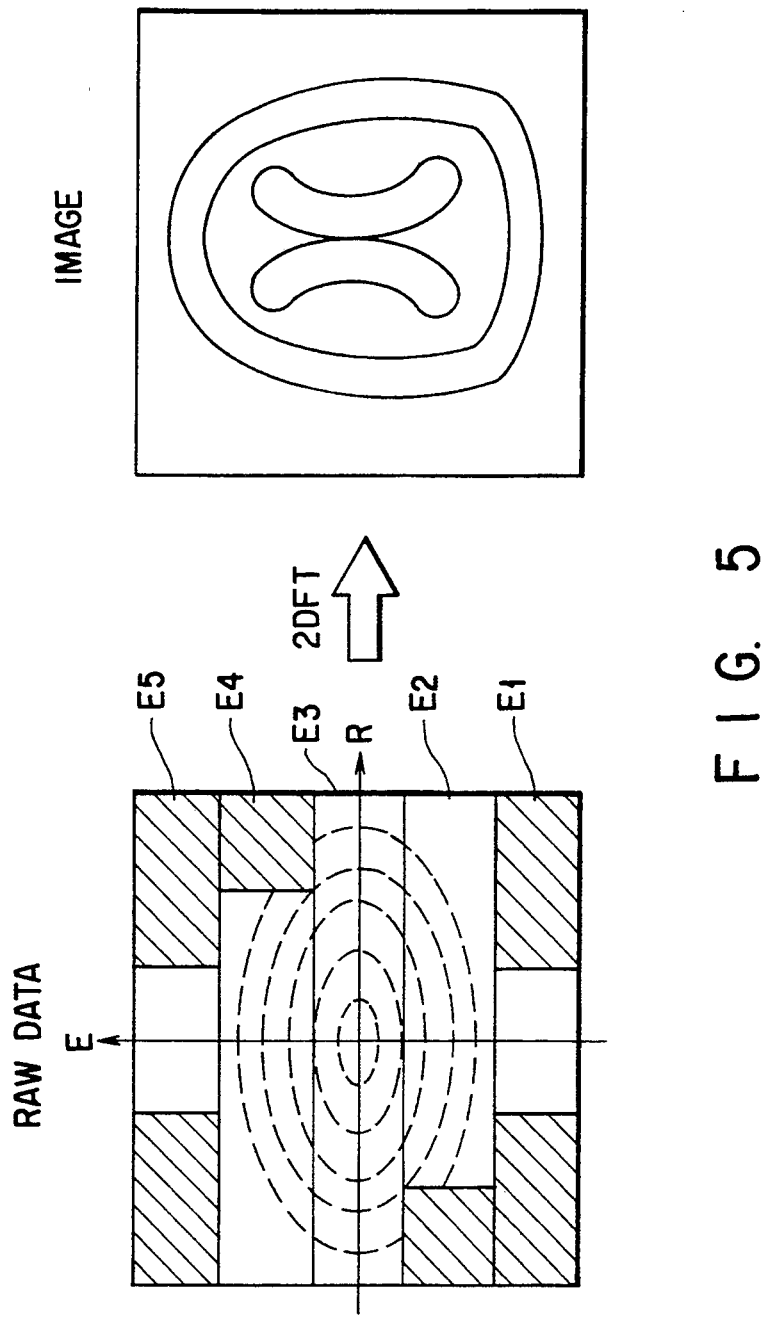
FIG. 5 shows a range of raw data acquired by the apparatus of FIG. 3.

The first echo signal E1 is generated at the time midway between the first and second 180° pulses P1 and P2. Thus, the acquired signal E1 is symmetrical with respect to its center. However, since the echo acquisition time TE1 is short, the positive and negative high-frequency regions in the read direction will not be acquired. The second echo signal E2 is generated prior to the time midway between the second and third 180° pulses P2 and P3. Thus, the acquired echo signal is asymmetrical. The positive high-frequency regions in the read direction will be acquired, but the negative high-frequency regions will not be acquired. The third echo signal E3 is generated at the time midway between the third and fourth 180° pulses P3 and P4. Thus, the acquired echo signal E3 is symmetrical with respect its center. Since the acquisition time TE3 for the third echo signal E3 is sufficiently long, all frequency regions in the read direction are acquired. The fourth echo signal E4 is generated subsequent to the time midway between the fourth and fifth 180° pulses P4 and P5. Thus, the acquired echo signal E4 is asymmetrical. Components in the negative high-frequency region in the read direction are acquired, but components in the positive high-frequency region will not be acquired. The fifth echo signal E5 is generated a time $\tau2$ after the fifth 180° pulse P5. Thus, the acquired echo signal E5 is asymmetrical. Since the acquisition time TE5 for the echo signal E5 is short, components in the positive and negative high-frequency regions will not be acquired. The raw data acquired is shown in FIG. 5. The shaded regions indicate regions where no data is acquired.

In this way the present embodiment reduces the time interval at which, of echo signals in multi-echo and multi-slice imaging, those echo signals are generated which correspond to high-frequency components in the phase encoding direction which little affect the signal-to-noise ratio and contrast of an image, and acquires the echo signals in a time shorter than a sufficient time to ensure a necessary signal-to-noise ratio, thereby reducing the bandwidth of the echo signals. This permits the acquisition time ts3 (<ts2) per slice to be reduced. In addition, the acquisition time for an echo signal which corresponds to low-frequency components in the phase encoding direction which much affects the signal-to-noise ratio and contrast of image is permitted to have a sufficient length without decreasing the number of multiple slices acquired within a preselected repetition time TR. In other words, by controlling each of the acquisition times for multiple echoes acquired by the multi-echo imaging scheme according to its severity of the influence on image the signal-to-noise ratio and contrast, the signal-to-noise ratio can be improved while reserving the number of multiple slices acquired.

In constructing an image, it is preferred that, for the echo signals E1, E2, E4, and E5 corresponding to high-frequency components in the phase encode direction, the high-frequency regions (shaded regions in FIG. 5) in the read direction on one side or on both sides of each echo from which data have not been acquired be filled with zero values to reserve the number of data points that ensures a necessary image resolution and then Fourier transformation be performed. For restoration of data that have not been acquired, complex conjugate components of data which have been acquired may be used instead of zero-filling.

According to the present invention, as described above, there is provided a magnetic resonance imaging apparatus which combines multi-echo and multi-slice imaging schemes which can improve the signal-to-noise ratio in images without decreasing the number of multiple slices acquired.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For example, although, in the above description, the spin-echo scheme was used as a method of acquiring magnetic resonance signals, another scheme, e.g., a gradient field (or field echo) scheme may be used. In addition, the phase encode amounts assigned for a plurality of echoes need not be limited to the example described above but may be arbitrary. For example, the assignment of phase encoding amounts need not be performed in regular order as shown in FIG. 4 but may be performed randomly. The time interval at which 180° pulses are generated (which, in the above embodiment, increases gradually and then decreases gradually) may also be varied accordingly. For example, in order to allocate data in the neighborhood of 0 encode step to the last echo signal E5 or the first echo signal E1, it is necessary to make the corresponding echo acquisition time TE5 or TE1 longer.

What is claimed is:

1. A magnetic resonance imaging apparatus comprising:
   means for applying an excitation pulse to an object to excite spins within the object for generating a magnetic resonance;
   means for generating multiple echo signals from the spins excited by said excitation pulse;
   means for phase-encoding the multiple echo signal generated by said generating means;
   means for assigning a different phase encoding amount to each of the multiple echo signals;
   acquisition means for acquiring at least a part of the multiple echo signals assigned different phase encoding amounts in a predetermined time shorter than an acquisition time which ensures a desired signal-to-noise ratio with the multiple echo signals other than said part being not acquired during the predetermined time;

obtaining means for obtaining the multiple echo signals not acquired by said acquisition means; and reconstructing means for reconstructing a magnetic resonance image using echo signals acquired by said acquisition means and by said obtaining means.

2. The apparatus according to claim 1, wherein said obtaining means obtains the echo signals not acquired by said acquisition means using complex conjugate components of the echo signals which have been acquired by said acquisition means.

3. The apparatus according to claim 1, wherein said obtaining means uses data of zeros as echo signals not acquired by said acquisition means.

4. The apparatus according to claim 1, wherein said acquisition means acquires an echo signal assigned a phase encoding amount of substantially 0 in the acquisition time to ensure a desired signal-to-noise ratio.

5. The apparatus according to claim 1, wherein said acquisition means acquires all the echo signals in times shorter than the acquisition time to ensure a desired signal-to-noise ratio.

6. The apparatus according to claim 1, wherein said acquisition means acquires echo signals assigned large phase encoding amounts in a time shorter than the acquisition time to ensure a desired signal-to-noise ratio.

7. A magnetic resonance imaging apparatus which applies a 90° pulse and multiple 180° pulses to a preselected slice of an object under examination to generate multiple echo signals, assigns a different phase encoding amount to each of the echo signals for acquisition of echo data for one slice, and acquires echo data for another slice within a preselected 90° pulse repetition time for the one slice, comprising:

means for acquiring an echo signal assigned a first phase encoding amount in an acquisition time to ensure a desired signal-to-noise ratio and acquiring echo signals assigned a second phase encoding amounts larger than the first in acquisition times shorter than the acquisition time to ensure the desired signal-to-noise ratio; and means for obtaining echo signals assigned the second phase encoding amounts not acquired by said acquisition means.

8. The apparatus according to claim 7, wherein said acquisition means changes a time interval between a 180° pulse and the next 180° pulse according to a phase encoding amount assigned to an echo signal generated in that time interval thereby changing the acquisition time for each of the echo signals.

9. The apparatus according to claim 8, wherein said acquisition means sets the acquisition time for each echo signal asymmetrical with respect to the time when the echo signal reaches its peak value.

10. The apparatus according to claim 7, wherein said acquisition means changes the phase encoding amount assigned to each of the echo signals at each of the 180° pulses, increases gradually the time interval at which the 180° pulses are generated and decreases it gradually after a time interval corresponding to an acquisition time for a desired signal-to-noise ratio to be reached.

* * * * *